(12) United States Patent
Black

(10) Patent No.: US 11,047,925 B2
(45) Date of Patent: Jun. 29, 2021

(54) SPLIT GROUND CONNECTOR

(71) Applicant: Sony Interactive Entertainment Inc., Tokyo (JP)

(72) Inventor: Glenn Black, San Mateo, CA (US)

(73) Assignee: Sony Interactive Entertainment Inc., Tokyo (JP)

(*) Notice: Subject to any disclaimer, the term of this patent is extended or adjusted under 35 U.S.C. 154(b) by 248 days.

(21) Appl. No.: 16/204,597

(22) Filed: Nov. 29, 2018

(65) Prior Publication Data

US 2020/0174057 A1 Jun. 4, 2020

(51) Int. Cl.
| | |
|---|---|
| *H01R 24/58* | (2011.01) |
| *G01R 31/68* | (2020.01) |
| *H04R 1/10* | (2006.01) |
| *H04R 3/00* | (2006.01) |
| *A63F 13/25* | (2014.01) |
| *A63F 13/30* | (2014.01) |
| *H01R 107/00* | (2006.01) |
| *H01R 13/703* | (2006.01) |

(52) U.S. Cl.
CPC .............. *G01R 31/68* (2020.01); *A63F 13/25* (2014.09); *A63F 13/30* (2014.09); *H01R 24/58* (2013.01); *H04R 1/1033* (2013.01); *H04R 3/00* (2013.01); *A63F 2300/403* (2013.01); *H01R 13/7031* (2013.01); *H01R 2107/00* (2013.01); *H04R 2420/05* (2013.01)

(58) Field of Classification Search
CPC .... G01R 31/68; H01R 24/58; H01R 2107/00; H01R 13/7031; H04R 1/1033; H04R 3/00; H04R 2420/05; A63F 13/25; A63F 13/30; A63F 2300/403

See application file for complete search history.

(56) References Cited

U.S. PATENT DOCUMENTS

| | | | |
|---|---|---|---|
| 2005/0169252 A1 | 8/2005 | Riggs | |
| 2007/0202950 A1 | 8/2007 | Hussaini et al. | |
| 2008/0164994 A1* | 7/2008 | Johnson | H04R 1/1041 340/533 |
| 2008/0305676 A1* | 12/2008 | Fiennes | H01R 24/58 439/489 |

(Continued)

FOREIGN PATENT DOCUMENTS

| | | |
|---|---|---|
| CN | 102088512 A | 6/2011 |
| KR | 2020140004667 U | 8/2014 |

(Continued)

OTHER PUBLICATIONS

International Search Report and Written Opinion dated Apr. 8, 2020, from the counterpart PCT application PCT/US19/63270.

(Continued)

*Primary Examiner* — Truc T Nguyen
(74) *Attorney, Agent, or Firm* — John L. Rogitz

(57) ABSTRACT

The second ring (third terminal) of a tip-ring-ring-sleeve (TRRS) plug is divided into two arcuate segments that face each other, with one segment being connected to a ground line and the other segment to a detect signal line. An extension port device can be connected to both segments to short the segments together to produce a detection signal indicating engagement of the plug with a jack in, e.g., a game controller such as a wireless DualShock® (DS-4) controller.

17 Claims, 6 Drawing Sheets

(56) References Cited

U.S. PATENT DOCUMENTS

| | | | |
|---|---|---|---|
| 2009/0110404 A1* | 4/2009 | Agevik | H01R 24/58 398/115 |
| 2009/0179768 A1* | 7/2009 | Sander | H04M 1/05 340/13.27 |
| 2013/0089291 A1* | 4/2013 | Joi | H01R 13/6471 385/77 |
| 2013/0108064 A1 | 5/2013 | Kocalar et al. | |
| 2013/0156216 A1* | 6/2013 | Shah | G01R 31/67 381/74 |
| 2014/0064512 A1* | 3/2014 | Yu | H04M 1/72527 381/74 |
| 2014/0072129 A1* | 3/2014 | Jung | G06F 13/4068 381/58 |
| 2014/0093103 A1* | 4/2014 | Breece, III | H03F 3/68 381/120 |
| 2014/0277643 A1* | 9/2014 | Villarreal | G06F 13/20 700/94 |
| 2015/0358719 A1* | 12/2015 | Mackay | H04R 29/00 381/384 |
| 2016/0373861 A1* | 12/2016 | Poulsen | H04R 5/04 |
| 2017/0054257 A1 | 2/2017 | Villarreal et al. | |
| 2017/0296077 A1* | 10/2017 | Liu | A61B 5/02416 |
| 2018/0018142 A1 | 1/2018 | Kim et al. | |
| 2018/0212375 A1 | 7/2018 | Ma | |

FOREIGN PATENT DOCUMENTS

| | | |
|---|---|---|
| TW | M364317 U | 9/2009 |
| WO | 2005074601 A2 | 8/2005 |

OTHER PUBLICATIONS

Taiwan Patent Office statement summarizing alleged teachings of reference TW M364317U1 (English abstract unavailable).

* cited by examiner

This connector must follow all the standard dimensions for a 4-pin plug except the third band is split into two separate signals. This modification is used to separate the ground and the detect signal, allowing for external control of PS4 headset detection

SPLIT GROUND CONNECTOR

FIELD

The application relates generally to detecting headphone engagement with a computerized device such as a computer game controller.

BACKGROUND

Many computer applications including computer simulation applications such as may be implemented by computer consoles allow a user to don a headset in addition to or in lieu of playing audio on broadcast speakers. Detecting engagement of the headset jack with the computer system, for example, with a game controller communicating with a game console, is often desirable for, e.g., muting broadcast audio and for other reasons.

SUMMARY

As understood herein, headphone detection that depends on the connected device, e.g., a game controller, to detect physical insertion of a plug into a jack to thereby return a "headphone detect" signal can incorrectly return "detect" when other objects might find their way into the jack, such as paper clips and the like. Such a detection indication may undesirably precipitate computer operation that assumes a headset with live signals is connected.

Accordingly, an assembly includes at least one headphone comprising at least left and right headphone speakers. At least one cord connects the left and right headphone speakers to a plug. The plug can include a conductive distal tip connector for receiving audio signals for play on a first one of the left and right headphone speakers, and proximal to the conductive distal tip connector, a first conductive ring for receiving audio signals for play on a second one of the left and right headphone speakers. The plug may further include, proximal to the first conductive ring, first and second arcuate conductive segments having respective first and second ends. The first end of the first arcuate conductive segment faces the first end of the second conductive segment and is spaced therefrom, while the second end of the first arcuate conductive segment faces the second end of the second conductive segment and is spaced therefrom. Proximal to the first and second arcuate conductive segments, a conductive sleeve may be provided for receiving signals from a microphone of the headset. The assembly further includes an extension port device electrically connectable to the first and second conductive segments and configured for electrically shorting the first and second conductive segments.

In example embodiments, at least one processor associated is with the extension port device for providing an indication that the plug is engaged with a jack responsive to the electrical shorting of the first and second conductive segments.

In some embodiments, the extension port device can be plugged into a computer simulation controller that communicates with a computer simulation console. The assembly may include one or both of the controller and console.

In examples, the plug can include a first electrically insulative segment interposed between the first ends of the first and second arcuate conductive segments and extending to each one of the first ends to electrically insulate the first ends from each other on the plug. The plug may also include a second electrically insulative segment interposed between the second ends of the first and second arcuate conductive segments and extending to each one of the second ends to electrically insulate the second ends from each other on the plug.

In examples, the first arcuate conductive segment is connected to a detect signal line and the second conductive segment is connected to a ground line. The extension port device may include at least one switch operable to short the detect signal line to the ground line through the first and second arcuate conductive segments.

In another aspect, a method includes returning a detect signal responsive to electrically shorting first and second arcuate conductive segments on an output device plug such as a headphone plug, virtual reality (VR) or augmented reality (AR) headset plug, etc. The first and second conductive segments have respective first and second ends, with the first end of the first arcuate conductive segment facing the first end of the second conductive segment and being spaced therefrom and with the second end of the first arcuate conductive segment facing the second end of the second conductive segment and being spaced therefrom. The method includes not returning a detect signal responsive to responsive to not electrically shorting the first and second arcuate conductive segments.

In another aspect, an assembly includes at least one output device with at least left and right speakers and at least one plug connected to the left and right speakers. The plug includes a conductive distal tip connector and, proximal to the conductive distal tip connector, first and second arcuate conductive segments having respective first and second ends. The first end of the first arcuate conductive segment faces the first end of the second conductive segment and is spaced therefrom, while the second end of the first arcuate conductive segment faces the second end of the second conductive segment and is spaced therefrom.

The details of the present application, both as to its structure and operation, can best be understood in reference to the accompanying drawings, in which like reference numerals refer to like parts, and in which:

DETAILED DESCRIPTION

Figure 1:
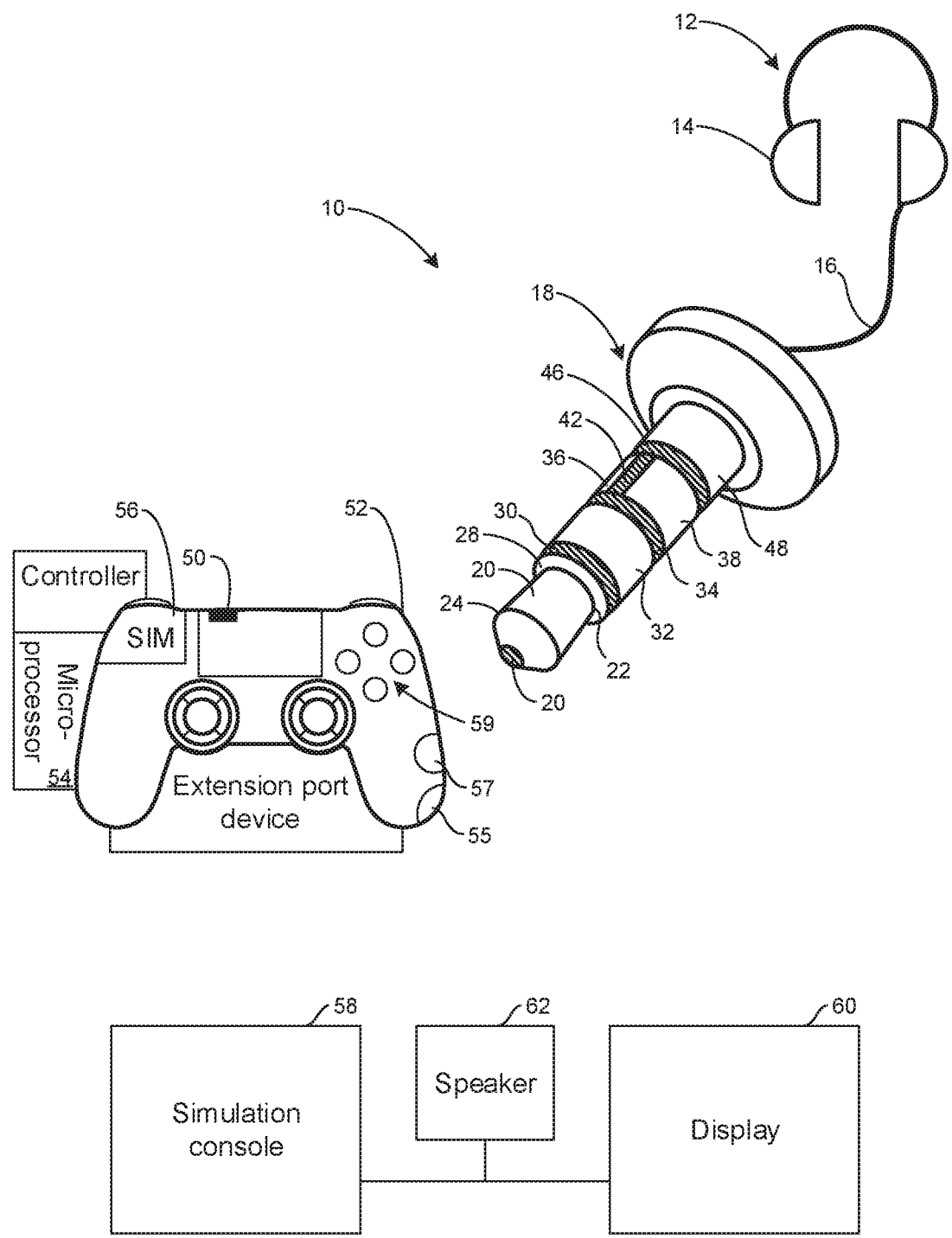
FIG. 1 is a partially schematic view showing a split ground connector in perspective and schematically showing the headphones connected to the connector, and further showing the extension port device as implemented in a computer simulation controller wirelessly communicating with a computer simulation console that outputs signals to a video display and one or more audio speakers.

FIG. 1 shows an assembly, generally designated 10, that can include at least one output device 12. The output device 12 may be implemented by, for example, a headphone, a VR or AR headset, etc. and typically includes at least left and right speakers 14. One or more cords 16 connect the left and right speakers 14 to a split ground connector 18 configured as a plug. The connector 18 includes an electrically conductive distal tip connector 20 for receiving audio signals for play on a first one of the left and right speakers 14. The distal tip connector 20 may be shaped somewhat frusto-conically from a relatively narrower proximal portion 22 to a relatively wider distal edge 24, and then taper back frusto-conically from the distal edge 24 to a distal tip 26, which may be blunt. A proximal ring portion 28 of the distal tip connector 20 can join with the proximal portion 22 as shown.

Proximal to the proximal ring portion 28 of the distal tip connector 20 is a first continuous ring-shaped insulator 30 to electrically insulate the distal tip connector 20 from a first conductive ring 32. The ring 32 may, e.g., receive audio signals for play on a second one of the left and right speakers 14. Thus, the first conductive ring 32, which can be a continuous cylindrical ring as shown, is proximal to the distal tip connector 20.

Figure 2:
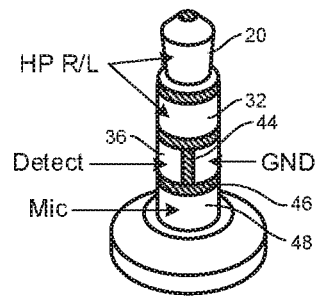
FIG. 2 is an elevational view of the split ground connector illustrating which signals are associated with which conductors of the connector.

Proximal to the first conductive ring 32 is a second continuous ring-shaped insulator 34 that may be cylindrical as shown and that electrically insulates the first conductive ring 32 from first and second arcuate conductive segments 36, 38. These segments 36, 38 form portions of a cylinder, and have respective first and second ends (only the first ends 40, 42 shown in FIG. 1). The first end 40 of the first arcuate conductive segment 36 faces the first end 42 of the second conductive segment 44 and as shown is spaced from the first end 42 of the second conductive segment 38. Referring briefly to FIG. 2, a first electrically insulative segment 44 is interposed between the first ends 40, 42 of the first and second arcuate conductive segments 36, 38, extending to each one of the first ends to electrically insulate the first ends from each other on the plug.

It is to be understood that opposite (e.g., by 180 degrees) of the first electrically insulative segment 44, a second electrically insulative segment is interposed between the second ends of the first and second arcuate conductive segments 36, 38, extending to each one of the second ends to electrically insulate the second ends from each other on the plug. The second ends of the segments 36, 38 thus also face each other and are spaced apart by an insulative segment.

Returning to FIG. 1, proximal to the segments 36, 38, a third continuous ring-shaped insulator 46 that may be cylindrical is disposed and proximal to that, a cylindrical conductive sleeve 48 is disposed for, e.g., receiving signals from a microphone of the headset.

It is to be understood that the electrically insulative rings and segments discussed above may be portions of a single cylindrical body onto which the electrically conductive components of the pug discussed above are disposed in the configuration shown.

As shown in FIG. 1, the connector 18 may be plugged into a jack or socket 50 that may be implemented in an extension port device 52 that is electrically connected to the first and second conductive segments 36, 36 and that, as discussed further below, is configured for electrically shorting the first and second conductive segments. In turn, the extension port device 52 may be associated with one or more processors 54 for providing an indication that the connector 18 is engaged with the jack 50 responsive to the electrically shorting of the first and second conductive segments 36, 38 as explained further below. In the example shown, the extension port device 52 is plugged into one or more receptacles such as the headphone jack 55 and extension port 57 of a computer simulation controller 56. Or, the extension port device may be integrated into the housing of the controller 56.

The controller 56 may communicate via wired and/or wireless paths with a computer simulation console 58. In an example non-limiting implementation, the controller 56 may be a DualShock® (DS-4) game controller and the computer simulation console 58 may be a PlayStation® console. The controller 56 typically includes manipulable buttons or keys to input commands into the console 58. The extension port device 52 may likewise comprise one or more manipulable buttons or keys 59 that can be manipulated to input commands to the console 58 via the controller 56. In any case, the computer simulation console may output video to a video display 60 and audio to one or more broadcast speakers 62. The audio may be output to the speakers 14 when the connector 18 is engaged with the jack 50 according to disclosure below.

Figure 3:
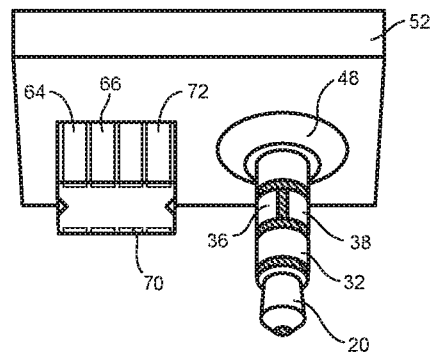
FIGS. 3 and 4 are illustrations of the split ground connector juxtaposed with contacts in the extension port device.
Figure 4:
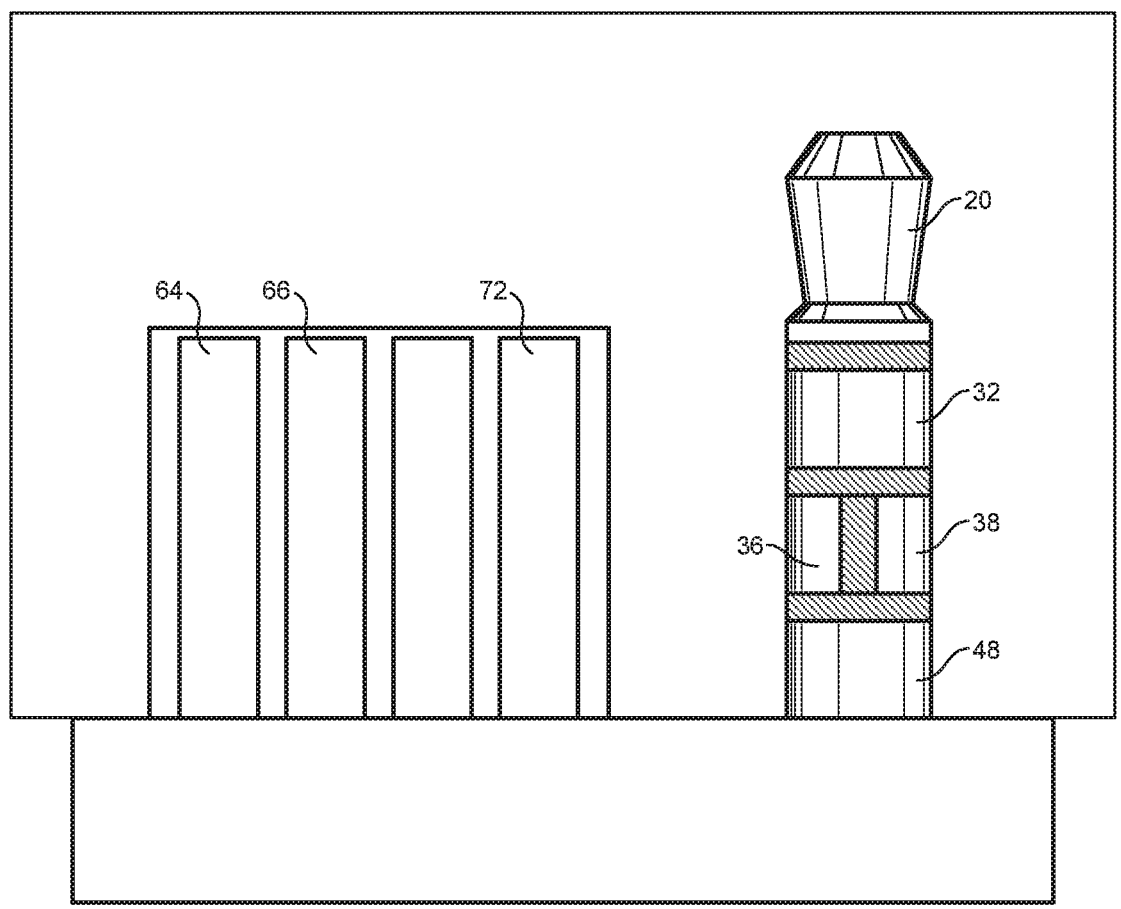

As indicated in cross-reference to FIGS. 2-4, the distal tip connector 20 of the connector 18, when engaged with the jack 50, may wipe against a left or right speaker audio line 64 to electrically connect the corresponding audio channel in the controller 56 to the corresponding headphone speaker 14. The first conductive ring 32 may wipe against the other of the left or right speaker audio line 66 to connect the corresponding audio channel in the controller 56 to the corresponding headphone speaker 14. On the other hand, the first arcuate conductive segments 36, 38 may wipe against a ground line 70. The sleeve 48 can engage a microphone line 72.

Figure 5:
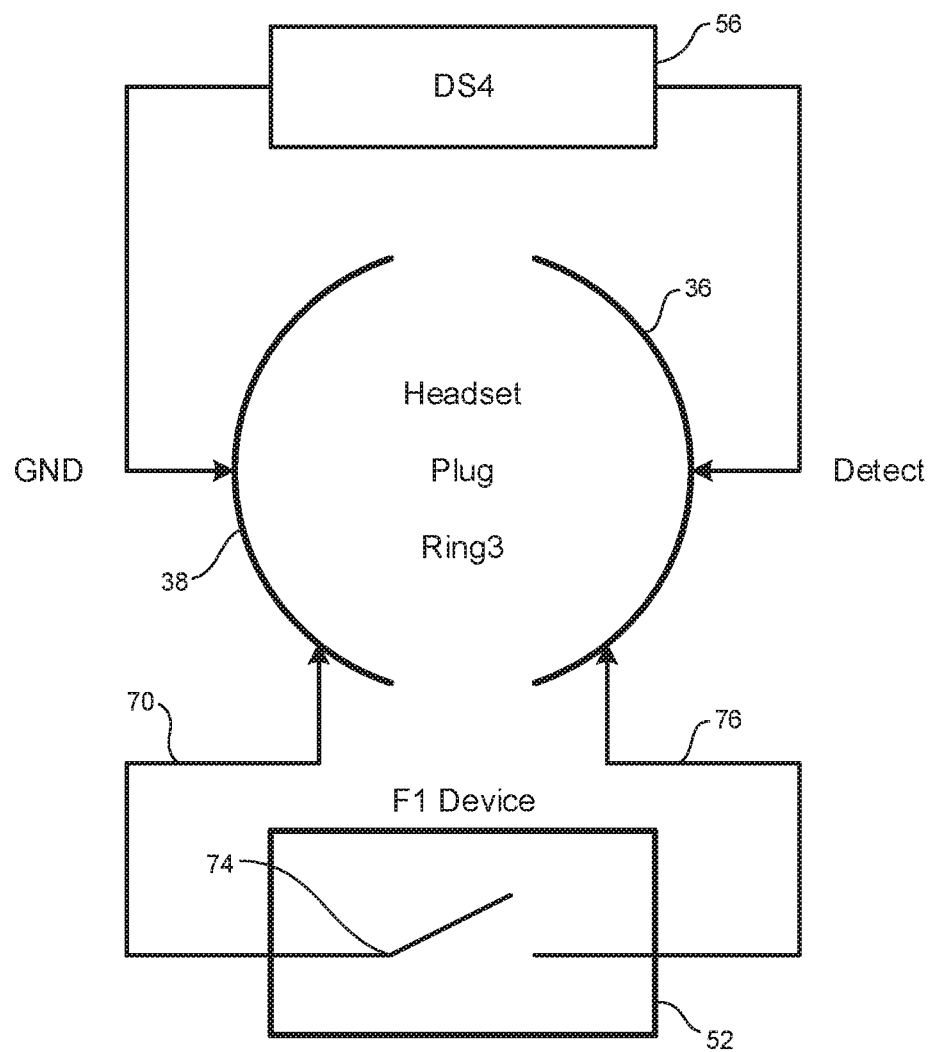
FIG. 5 is an electric schematic showing the arcuate segments of the split ground connector, the extension port device, and the computer simulation controller.

FIG. 5 shows that the extension port device 52 may include at least one switch 74 that is operable to short a detect signal line 76 to the ground line 70 through the first and second arcuate conductive segments 36, 38. In one embodiment, the switch 74 can be controlled by the processor 54 of the extension port device shown in FIG. 1 according to the logic below.

The headphone connector 18 thus may be configured a TRRS (tip-ring-ring-sleeve) connector with reference lines connected to different terminal contacts or with a further control wire integrated in the headphone cable and connected to an additional terminal connector. The headphone connector may be configured, e.g. as a stereo plug, a mini-jack, a mini-stereo jack, a headphone jack, a telephone connector or a bottom plug, for example a 2.5 mm or 3.5 mm TRRS jack plug. Thus, the connector is a four-pole connector that may conform to the American headphone jack (or Cellular Telecommunications Industry Association (CTIA)) standard, less preferably the Open Mobile Terminal Platform (OMTP) standard, or other standards.

Figure 6:
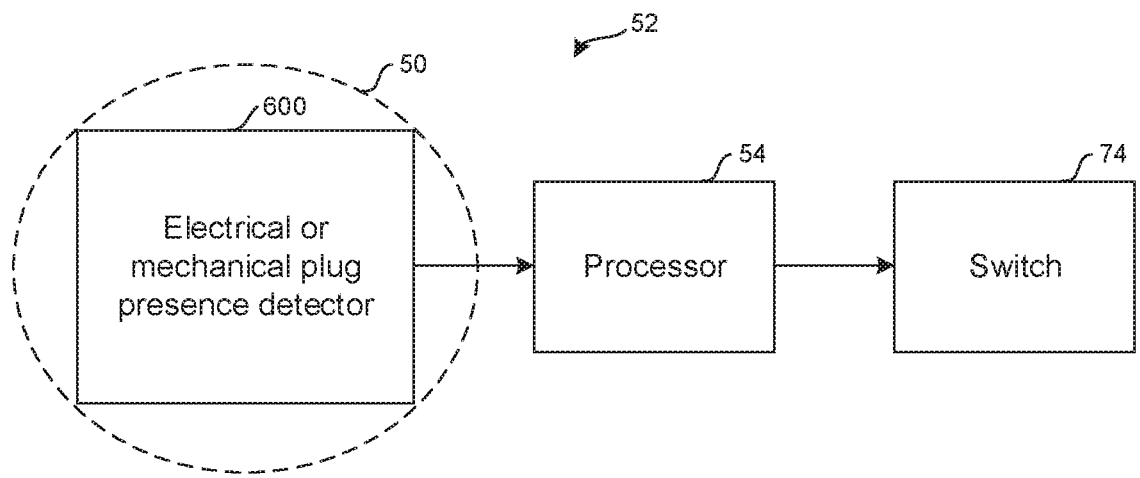
FIG. 6 is a simplified block diagram of components of the extension port device.

FIG. 6 shows a simplified block diagram of an example extension port device 52 in which the processor 54 controls the switch 74 consistent with principles herein based at least in part on a detect signal from an electrical or mechanical presence detector 600 operatively coupled to the jack 50 to detect the physical presence of the plug.

Figure 7:
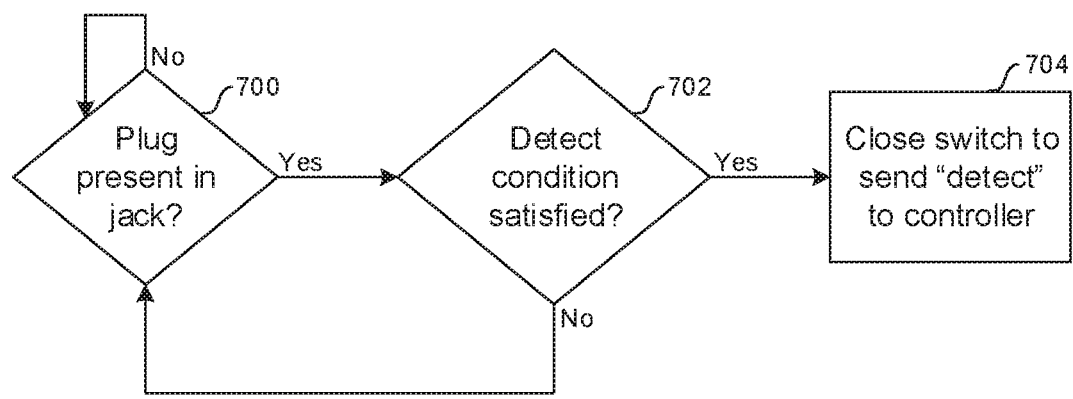
FIG. 7 is a flow chart of example logic consistent with present principles.

FIG. 7 illustrates example logic that may be executed by the processor 54 in flow chart form for illustration, it being understood that state logic may be used. Decision diamond 700 indicates that upon detecting the presence of a plug in the jack 50, the logic may move to state 702 in which it may be determined whether a detect condition is satisfied. In some cases, the detect condition always is satisfied upon detecting physical presence of the plug in the jack. In other cases, the detect condition may not be satisfied unless a condition in addition to physical presence of the plug in the jack is present. Such an additional detect condition may include, by way of example and not of limitation, image recognition based on signals from a camera associated with the game console indicating that a person is wearing a headset or headphone or other output device with ear speakers. Other detect conditions may be used.

In any case, once it is determined that a detect signal should be generated, the logic moves to block 704 to close the switch 74 and thereby short the detect line to the ground line. This shorting causes a signal to be sent to the game controller 52 indicating that the audio plug of an output device 12 such as a headphone or VR or AR headset is engaged with the assembly, which in turn causes the controller/console to execute appropriate action, e.g., mute broadcast speakers and route audio signals to the jack of the controller and, hence, to the jack 50 of the extension port device 52.

Instead of a processor-based switch 74, the jack 50 of the extension port device 52 may include electrical contacts that engage the segments 36, 38 upon insertion of the plug into the jack 50 to short the detect line to the ground line.

Figure 8:
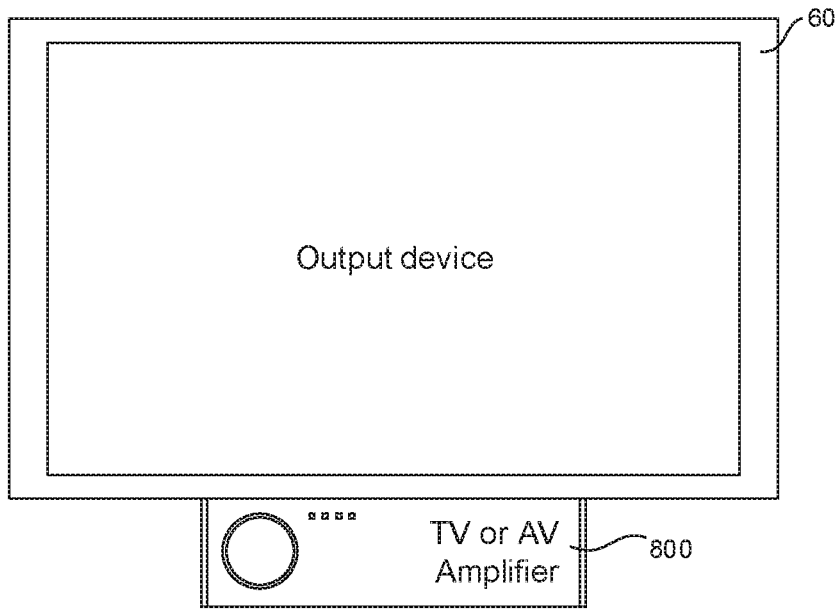
FIG. 8 is an illustration of display indication of headset connection with the split ground connector engaged with the jack of the computer simulation controller but with the arcuate segments not shorted together.
Figure 9:
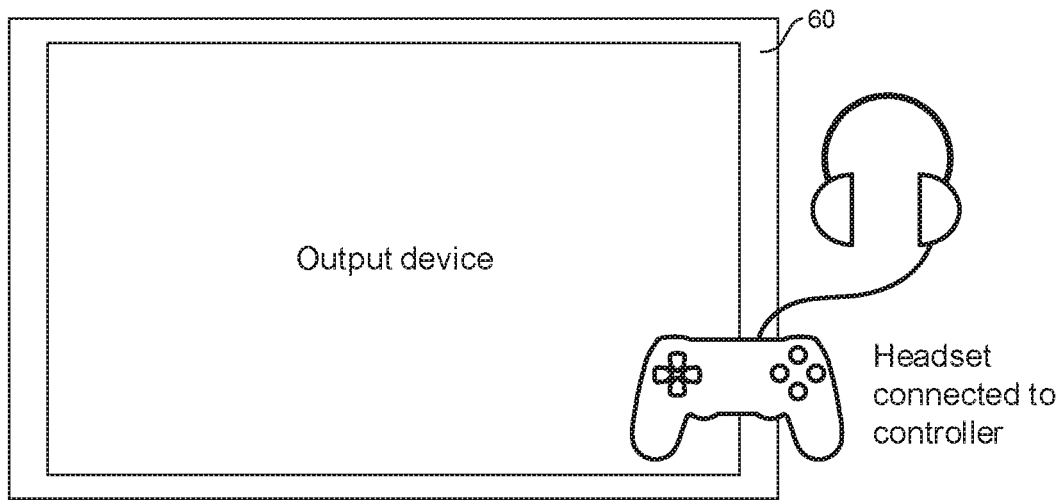
FIG. 9 is an illustration of display indication of headset connection with the split ground connector engaged with the jack of the computer simulation controller with the arcuate segments shorted together.

FIGS. 8 and 9 illustrate further. In FIG. 8, a presentation generated by the controller 52 or console 58 is presented on the display 60, indicating at 800 that the audio output device in use is a broadcast speaker or speakers such as may be driven by a TV or audio-video (AV) amplifier. This presentation is responsive to the switch 74 being open (or responsive to no plug at all being detected in the jack 50).

On the other hand, FIG. 9 illustrates at 900 that the audio output device in use are headphone speakers on a headphone or headset device that is connected to the controller 52. The presentation of FIG. 9 is responsive to the switch 74 being closed with the plug being engaged with the jack 50. In addition to the different visual displays of FIGS. 8 and 9, as discussed previously, the configuration of the switch 74 also establishes operational parameters including whether audio is played on broadcast or headphone speakers.

While particular techniques are herein shown and described in detail, it is to be understood that the subject matter which is encompassed by the present invention is limited only by the claims.

Components included in one embodiment can be used in other embodiments in any appropriate combination. For example, any of the various components described herein and/or depicted in the Figures may be combined, interchanged or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together, etc.

What is claimed is:

1. An assembly, comprising:
   at least one headphone comprising at least left and right headphone speakers;
   at least one cord connecting the left and right headphone speakers to a plug, the plug comprising:
   a) a conductive distal tip connector for receiving audio signals for play on a first one of the left and right headphone speakers;
   b) proximal to the conductive distal tip connector, a first conductive ring for receiving audio signals for play on a second one of the left and right headphone speakers;
   c) proximal to the first conductive ring, first and second arcuate conductive segments having respective first and second ends, the first end of the first arcuate conductive segment facing the first end of the second conductive segment and being spaced therefrom, the second end of the first arcuate conductive segment facing the second end of the second conductive segment and being spaced therefrom, and
   d) proximal to the first and second arcuate conductive segments a conductive sleeve for receiving signals from a microphone of the headset; and
   an extension port device electrically connectable to the first and second conductive segments and configured for electrically shorting the first and second conductive segments.

2. The assembly of claim 1, comprising at least one processor associated with the extension port device for providing an indication that the plug is engaged with a jack responsive to the electrically shorting of the first and second conductive segments.

3. The assembly of claim 1, wherein the extension port device is connected to a jack of a computer simulation controller.

4. The assembly of claim 3, comprising the computer simulation controller.

5. The assembly of claim 4, comprising at least one computer simulation console communicating with the computer simulation controller.

6. The assembly of claim 1, wherein the plug further comprises:
   a first electrically insulative segment interposed between the first ends of the first and second arcuate conductive segments and extending to each one of the first ends to electrically insulate the first ends from each other on the plug; and
   a second electrically insulative segment interposed between the second ends of the first and second arcuate conductive segments and extending to each one of the second ends to electrically insulate the second ends from each other on the plug.

7. The assembly of claim 1, wherein the first arcuate conductive segment is connected to a detect signal line and the second conductive segment is connected to a ground line.

8. The assembly of claim 1, wherein the extension port device comprises at least one switch operable to short a detect signal line to the ground line through the first and second arcuate conductive segments.

9. An assembly, comprising:
   at least one output device comprising at least left and right speakers;
   at least one plug connected to the left and right speakers, the plug comprising:
   a) a conductive distal tip connector;
   b) proximal to the conductive distal tip connector, first and second arcuate conductive segments having respective first and second ends, the first end of the first arcuate conductive segment facing the first end of the second conductive segment and being spaced therefrom, the second end of the first arcuate conductive segment facing the second end of the second conductive segment and being spaced therefrom; and an extension port device electrically connected to the first and second conductive segments and configured for electrically shorting the first and second conductive segments.

10. The assembly of claim 9, wherein the conductive distal tip connector is for receiving audio signals for play on a first one of the left and right speakers, and the plug comprises:

a first conductive ring for receiving audio signals for play on a second one of the left and right speakers.

11. The assembly of claim 9, wherein the first conductive ring is distal to the first and second arcuate conductive segments.

12. The assembly of claim 9, wherein the plug comprises:

a conductive sleeve for receiving signals from a microphone of the output device.

13. The assembly of claim 9, wherein a conductive sleeve is proximal to the first and second arcuate conductive segments.

14. An assembly, comprising:

at least one output device comprising at least left and right speakers;

at least one plug connected to the left and right speakers, the plug comprising:

a) a conductive distal tip connector;

b) proximal to the conductive distal tip connector, first and second arcuate conductive segments having respective first and second ends, the first end of the first arcuate conductive segment facing the first end of the second conductive segment and being spaced therefrom, the second end of the first arcuate conductive segment facing the second end of the second conductive segment and being spaced therefrom;

at least one processor associated with an extension port device for providing an indication that the plug is engaged with a jack responsive to the electrically shorting of the first and second conductive segments.

15. A method, comprising:

returning a detect signal responsive to electrically shorting first and second arcuate conductive segments on a plug, the first and second conductive segments having respective first and second ends, the first end of the first arcuate conductive segment facing the first end of the second conductive segment and being spaced therefrom, the second end of the first arcuate conductive segment facing the second end of the second conductive segment and being spaced therefrom; and not returning a detect signal responsive to responsive to not electrically shorting the first and second arcuate conductive segments.

16. The method of claim 15, wherein the first and second arcuate conductive segments are segments of a ring.

17. The method of claim 15, comprising moving a switch to short the first and second arcuate conductive segments.

* * * * *